United States Patent
Tan et al.

(10) Patent No.: US 11,449,104 B2
(45) Date of Patent: Sep. 20, 2022

(54) FLEXIBLE DISPLAY WITH ELECTROMAGNETIC ADJUSTMENT

(71) Applicant: Google LLC, Mountain View, CA (US)

(72) Inventors: Wenli Tan, Taoyuan (TW); Victor Cheng, Taipei (TW); Vincent Chien, New Taipei (TW); Davis Ou, New Taipei (TW); Eugene Liao, Taipei (TW); Han-Wen Yeh, New Taipei (TW); Mike Liu, New Taipei (TW); Chun Tseng, Taipei (TW)

(73) Assignee: Google LLC, Mountain View, CA (US)

( * ) Notice: Subject to any disclaimer, the term of this patent is extended or adjusted under 35 U.S.C. 154(b) by 54 days.

(21) Appl. No.: 16/948,053

(22) PCT Filed: Nov. 5, 2019

(86) PCT No.: PCT/US2019/059844
§ 371 (c)(1),
(2) Date: Aug. 28, 2020

(87) PCT Pub. No.: WO2020/112314
PCT Pub. Date: Jun. 4, 2020

(65) Prior Publication Data
US 2021/0165457 A1    Jun. 3, 2021

Related U.S. Application Data

(60) Provisional application No. 62/771,403, filed on Nov. 26, 2018.

(51) Int. Cl.
*G06F 1/16*    (2006.01)
*G09G 3/20*    (2006.01)
(Continued)

(52) U.S. Cl.
CPC .......... *G06F 1/1652* (2013.01); *G06F 1/1616* (2013.01); *G06F 1/1681* (2013.01);
(Continued)

(58) Field of Classification Search
CPC .... G06F 1/1652; G06F 1/1616; G06F 1/1681; G06F 1/1641; G06F 2203/04102;
(Continued)

(56) References Cited

U.S. PATENT DOCUMENTS 8,723,791 B2 * 5/2014 Kalaldeh ............. G06F 3/03545
345/157
9,343,213 B2   5/2016 Peng et al.
(Continued)

FOREIGN PATENT DOCUMENTS

JP      2017510065 A      4/2017

OTHER PUBLICATIONS

International Search Report and Written Opinion for Application No. PCT/US2019/059844, dated Mar. 31, 2020, 10 pages.

*Primary Examiner* — Abhishek M Rathod
(74) *Attorney, Agent, or Firm* — Brake Hughes Bellermann LLP

(57) ABSTRACT

A flexible display that can be adjusted by an electromagnetic mechanism to remove a deformation is disclosed. The flexible display is attached to a body that is configurable in a folded configuration or an unfolded configuration by a hinge mechanism. When unfolded the flexible display includes a deformation (i.e., warp) in an area around the hinge mechanism. Accordingly, an electromagnet is included with the hinge mechanism to remove the deformation by attracting a magnetic element is disposed on a back surface of the flexible display.

18 Claims, 5 Drawing Sheets

(51) Int. Cl.
*H01F 7/06* (2006.01)
*H01L 27/32* (2006.01)
*H01L 51/00* (2006.01)
*H01L 51/52* (2006.01)
*H01F 7/20* (2006.01)

(52) U.S. Cl.
CPC ............ *H01F 7/06* (2013.01); *H01L 27/3244* (2013.01); *H01L 51/0097* (2013.01); *H01L 51/5237* (2013.01); *G06F 1/1641* (2013.01); *G09G 3/2096* (2013.01); *H01F 7/20* (2013.01); *H01L 2251/5338* (2013.01)

(58) Field of Classification Search
CPC ........ G06F 1/1626; G06F 1/1643; G06F 1/16; G06F 3/0412; G06F 1/1618; G06F 1/1637; G06F 1/1683; G06F 3/045; G06F 3/0487; G06F 1/1601; G06F 1/163; G06F 1/1635; G06F 1/165; G06F 1/1656; G06F 1/1677; G06F 1/1679; G06F 1/1686; G06F 1/1694; G06F 2203/04103; G06F 2203/04104; H01F 7/06
See application file for complete search history.

(56) References Cited

U.S. PATENT DOCUMENTS

| | | | |
|---|---|---|---|
| 10,244,088 B2* | 3/2019 | Kikuchi | ............... G09G 3/3208 |
| 2014/0226275 A1* | 8/2014 | Ko | ........................ G06F 1/1681 |
| | | | 361/679.27 |
| 2015/0233162 A1 | 8/2015 | Lee et al. | |
| 2016/0070303 A1* | 3/2016 | Lee | ........................ G06F 1/1641 |
| | | | 361/679.27 |
| 2016/0278222 A1* | 9/2016 | Lee | ................... G02F 1/133305 |
| 2017/0038798 A1* | 2/2017 | Lee | ........................ G06F 1/1616 |
| 2017/0075459 A1* | 3/2017 | Kauhaniemi | ........ G09G 3/3225 |
| 2018/0164854 A1 | 6/2018 | Wood et al. | |
| 2018/0267571 A1 | 9/2018 | Chen | |
| 2018/0375975 A1* | 12/2018 | Kikuchi | ............... G06F 1/1681 |
| 2019/0036068 A1* | 1/2019 | Kim | ..................... G06F 1/1641 |
| 2019/0243424 A1* | 8/2019 | Lee | ........................ G06F 1/1679 |

* cited by examiner

FLEXIBLE DISPLAY WITH ELECTROMAGNETIC ADJUSTMENT

CROSS-REFERENCE TO RELATED APPLICATIONS

This application is a 35 U.S.C. § 371 National Phase Entry Application from PCT/US2019/059844, filed on Nov. 5, 2019, entitled "FLEXIBLE DISPLAY WITH ELECTROMAGNETIC ADJUSMENT", which claims the benefit of U.S. Provisional Patent Application No. 62/771,403, filed on Nov. 26, 2018, the disclosures of which are incorporated by reference herein in their entirety.

FIELD OF THE DISCLOSURE

The present disclosure relates to displays and, more specifically, to a method and device for removing a deformation in a flexible display, which can be used in a mobile computing device.

BACKGROUND

Mobile computing devices (i.e., portable devices) may be embodied in various ways, including (but not limited to) smartphones and tablets. The selection of which sort of device to use depends on a user's situation. For situations in which a large display is more desirable than portability, a user may select a tablet. Conversely, for situations in which portability is more desirable than a large display, a user may select a smartphone. The need for a selection of one device over another device may be eliminated if a portable device can be mechanically configured as either as a smartphone or as a tablet.

Thin film displays (i.e., flexible displays) may provide a mechanism for this mechanical configuration. OLED displays, for example, can operate in a non-planar (e.g., folded) or a substantially planar (e.g., unfolded) configuration, thereby facilitating a mechanical reconfiguration of a mobile computing device from a smartphone-like configuration to a tablet-like configuration. New methods and devices are needed to improve the use of flexible displays in applications that require folded and unfolded configurations.

SUMMARY

Accordingly, in one general aspect, the present disclosure describes a mobile computing device that includes a body. The body includes a first portion and a second portion that are connected by a hinge mechanism. Operation of the hinge mechanism allows the body to be configured in a folded configuration or in an unfolded configuration. A flexible display is connected to and supported by the body in the folded or the unfolded configuration. In a configuration (e.g., the unfolded configuration), the flexible display may have a deformation. To remove the deformation, the mobile computing device further includes an electromagnetic mechanism.

In another general aspect, the present disclosure describes a method for configuring a mobile computing device. The method includes unfolding a first portion and a second portion of a body of the mobile computing device using a hinge mechanism. When unfolded, a flexible display of the mobile computing device covers the first and second portions, but has a deformation resulting from the unfolding. Accordingly, the method includes the step of activating an electromagnet in the hinge mechanism to attract a magnetic element disposed on a surface of the flexible display towards the hinge mechanism to remove the deformation resulting from the unfolding.

In another aspect, the present disclosure embraces a display. The display includes a body that is configurable in a folded configuration or in an unfolded configuration by a hinge mechanism. The display also includes a flexible display that is attached to the body. The flexible display can be folded or unfolded according to the configuration of the body. The unfolding of the flexible display can result in a deformation in the flexible display. Accordingly, an electromagnet in the hinge mechanism may be activated to produce a magnetic field. The magnetic field may attract a magnetic element disposed on a back surface of the flexible display to remove the deformation.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other, and like reference symbols in the various drawings indicate like elements.

DETAILED DESCRIPTION

Figure 1A:
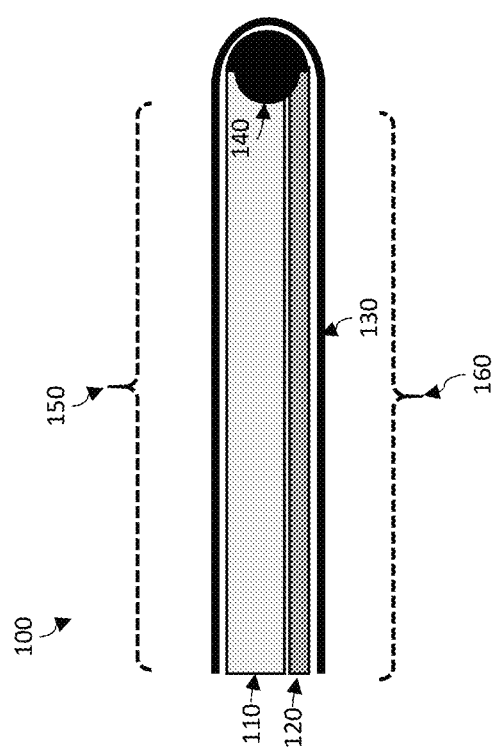
FIG. 1A depicts a side view of a mobile computing device in a first mechanical configuration in which a flexible display is folded

Flexible (i.e., foldable) displays can display information (e.g., graphics, text, video, etc.) during or after being flexed (i.e., bent, rolled, curved, folded, etc.). For example, opposite sides of a flexible display may be folded towards each other to form a folded configuration. In the folded configuration, information may be presented on a surface of the display, such as the outer surface, in much the same way as information is presented on a front cover, a back cover, and a spine of a book. The flexible display may also be unfolded flat to form an unfolded (i.e., flat) configuration. In the unfolded configuration, information may be presented on a surface of the display in much the same way as information is presented on a typical flat panel display.

Various technologies may be used in a flexible display. For example, electronic ink or organic light emitting diode (OLED) technologies may be used. An OLED display may include multiple layers that are laminated together. The layers can include one or more organic layers that can be stimulated by a current to produce light. The layers can also include one or more layers for electrical coupling (e.g., electrodes), electronic control (e.g., thin film transistor (TFT)), mechanical stability, environmental (e.g., moisture) protection, and light conditioning (e.g., polarization, filtering, etc.). Each layer may be constructed on or formed from a flexible substrate (e.g., polyimide, polyethylene terephthalate (PET)) so that the laminated OLED display is flexible (e.g., can be flexed by average hand strength).

The number of layers, the material properties (e.g., flexibility, elasticity, etc.) of each layer, and the operating environment (e.g., temperature) can determine a range of bending (i.e., flection) without damage. In some cases, bending may cause deformations that do not damage the flexible display but that can interfere with a viewing experience (e.g., due to poor esthetics, unwanted reflections). For example, folding and/or unfolding a flexible display may create a deformation (i.e., crease, wrinkle, warp, ridge) in an otherwise smooth, flat surface of the flexible display (e.g., in the unfolded configuration). This deformation may be reduced or eliminated over time as the layers resume their normal shape, but in some cases, the deformation is, for all intents and purposes, permanent unless some action is taken to reduce or eliminate it.

Mobile computing devices (e.g., smartphones, tablets) must typically balance the demands of portability with the demands of ease of use. This balance has traditionally affected the size of the display of the mobile computing device. For example, a mobile computing device designed for portability may have a small display so that the body of the device can be held and operated with a single hand and/or can carried in a purse or a pocket. A mobile computing device designed for ease of use may have a large display for easy viewing and for convenient touch screen operation. A flexible display, however, can allow a single mobile computing device to be configured to embody all of these characteristics.

A side view of a mobile computing device in a folded configuration is shown in FIG. 1A. The mobile computing device 100 includes a body that has a first portion 110 and a second portion 120. The first portion 110 and the second portion 120 are connected by a hinge mechanism 140. In the folded configuration, the first portion 110 and the second portion 120 of the body are contiguous at inner surfaces of the folded body, and a flexible display 130 (e.g., OLED display) is wrapped around outer surfaces of the folded body. A first part 150 of the flexible display 130 is connected to and supported by the first portion 110 of the body and can serve as the front of the mobile computing device in the folded configuration. A second part 160 of the display 130 is connected to, and supported by, the second portion 120 of the body and can serve as the back of the mobile computing device in the folded configuration.

Figure 1B:
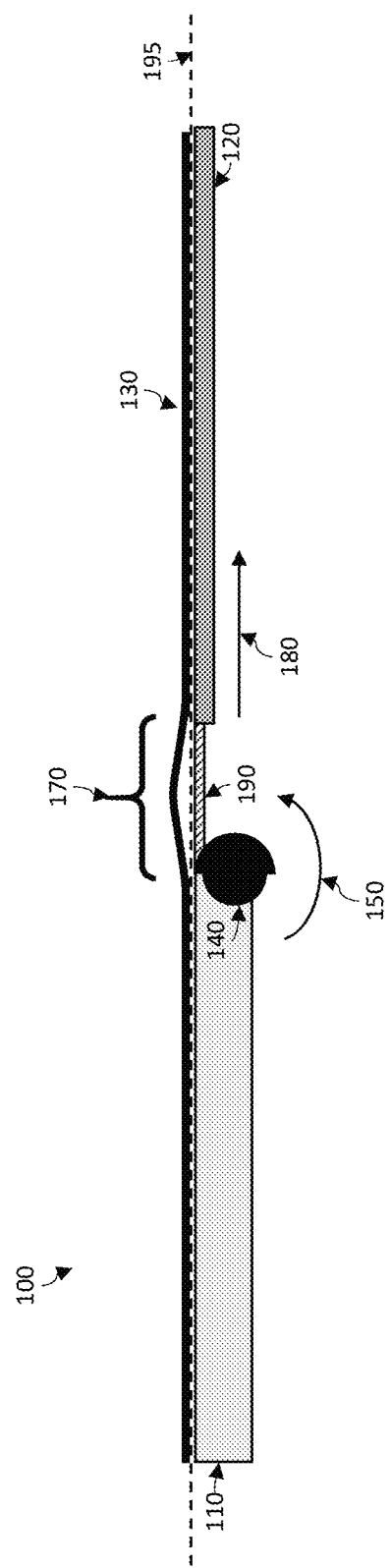
FIG. 1B depicts a side view of a mobile computing device in a second mechanical configuration in which a flexible display is unfolded.

A side view of a mobile computing device in an unfolded configuration is shown in FIG. 1B. In the unfolded configuration, the first portion 110 and the second portion 120 of body are not contiguous because the inner surfaces of the folded body are unfolded at the hinge mechanism 140. When unfolded, the first portion 110 and the second portion 120 form a surface 195 that is substantially flat. The flexible display 130, in the unfolded configuration, is ideally unfolded flat (i.e., flush) with the surface 195 in order to create a smooth, flat display. The unfolded flexible display may have dimensions that are similar in size to a conventional flat panel display of a tablet computer.

The unfolding of the display may result in a deformation of the display 130 that prevents the display from being flush with the surface 195 in all areas. The deformation may result from the mechanical response of one or more layers in the flexible display to the stresses created by the folding and unfolding, which can be strongest in the portion of the display that is bent during folding. The deformation may be a distortion (i.e., relative to the flat surface 195) of any shape, size, or orientation. As shown in FIG. 1B, the deformation, may be a ridge (i.e., warp) 170 in the flexible display 130 that rises above the surface 195 and that is substantially aligned with the hinge mechanism 140. In other words, the ridge 170 deformation in the flexible display 130 extends along a direction defined by an axis of rotation of the hinge mechanism 140. In some cases, the ridge 170 deformation may rise above the surface 195 by less than five millimeters (mm) (e.g., 3 mm).

In some embodiments, the hinge mechanism 140 may produce a rotational motion 150 and a lateral motion 180 between the first portion 110 and the second portion 120 when the body is reconfigured from a folded configuration (see FIG. 1A) to an unfolded configuration (see FIG. 1B). To guide the lateral motion 180, the hinge mechanism 140 may include one or more guides 190 that the second portion 180 of the body moves along during the lateral motion 180. The lateral motion may help to eliminate deformations in the flexible display in the unfolded configuration (e.g., by a stretching force), but may not be sufficient to remove a deformation entirely, without an additional force.

Figure 2:
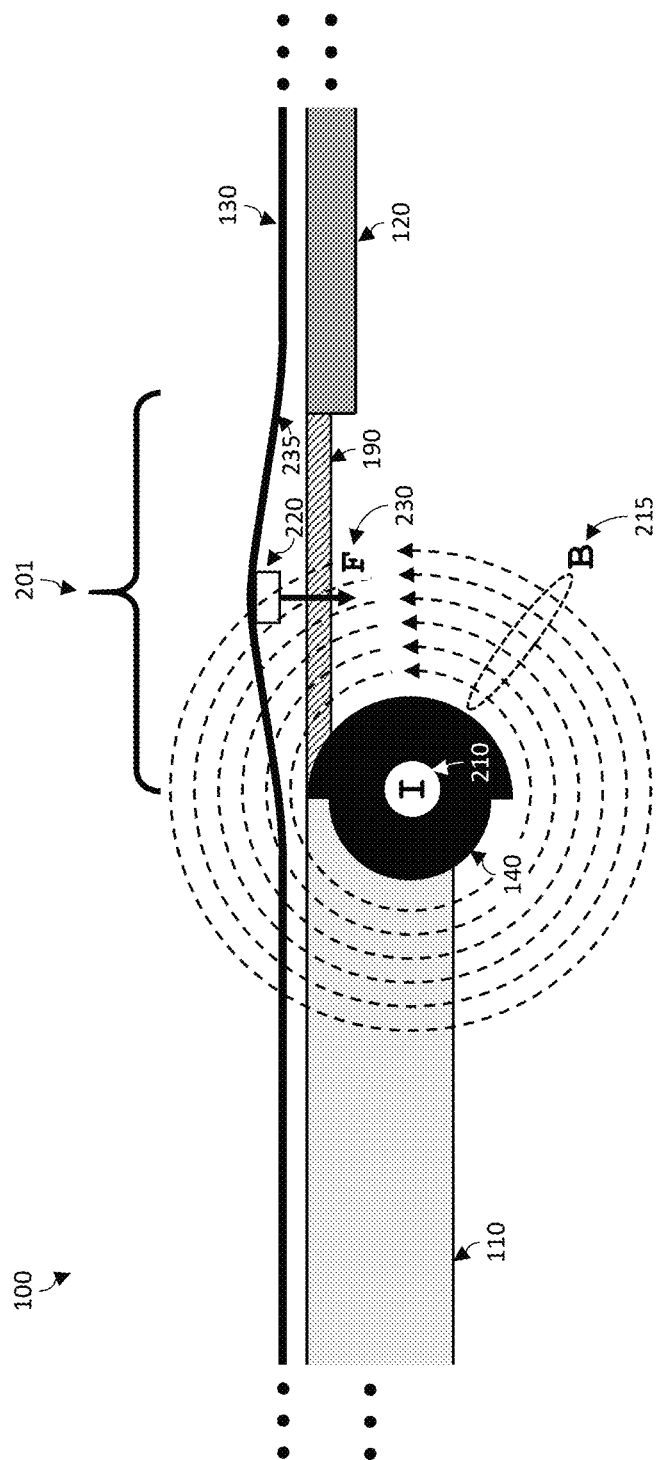
FIG. 2 depicts a side view of a mobile computing device having an electromagnetic mechanism for removing a deformation in the flexible display.

A side view of a portion of the mobile computing device 100 is shown in FIG. 2. As shown, the first portion 110 and the second portion 120 of the body are in an unfolded configuration. The flexible display 130 has a deformation 201 in a location corresponding to the hinge mechanism 140. For example, the deformation 201 may be located an area of the flexible display 130 that is bent around the hinge mechanism 140 when the body is in a folded configuration. This area may be aligned with and adjacent to the hinge mechanism 140 when the body is in an unfolded configuration.

The deformation 201 may be reduced through the lateral movement (i.e., along a guide 190) of the second portion 120 but an additional force, F, 230 may be necessary to remove it entirely so that the flexible display forms a flat surface (e.g., over the entire area of the flexible display, over a viewing area of the flexible display). In order to apply the additional force to the flexible display 130, the mobile computing device 100 can include an electromagnetic mechanism.

The electromagnetic mechanism may include an electromagnet that is incorporated with (e.g., within, attached to, etc.) the hinge mechanism 140 and a magnetic element 220 that is incorporated with (e.g., within, attached to, etc.) the flexible display 130. When activated (i.e., when energized with a current), the electromagnet creates a magnetic field, B, 215 that acts to draw the magnetic element 220 towards the electromagnet. This action has the effect of reducing a height of the deformation 201 so that the flexible display 130 may be made substantially flat (e.g., flat) in an area of the deformation 201.

The electromagnet may be embodied in various ways. The electromagnet can include a magnetic field generator. The magnetic field generator may include a conductor 210 and a current source (e.g., battery) coupled to the conductor 210. The magnetic field, B, 215 generated by the magnetic field generator may be adjusted by adjusting the current carried by the conductor 210. In a possible embodiment, the conductor may be configured to increase or steer the magnetic field, B. For example, the conductor may be configured as a loop, coil, or solenoid. When magnetic field generator includes a solenoid, the magnetic field, B, generated may be adjusted by adjusting the number of turns (n) of the solenoid. Additionally, the direction of the magnetic field (B) may be adjusted by adjusting the orientation of the solenoid. In some embodiments, the electromagnet may also include one or more pole pieces. A pole piece is a mass of ferrous material through which the lines of magnetic field are concentrated, distributed, and/or directed.

As shown in FIG. 2, a current (I) in a direction along the length of the hinge mechanism (i.e., aligned with an axis of rotation of the hinge mechanism) may form an electromagnet to generate a magnetic field (B) 215 proximate to (e.g., around) the hinge mechanism 140. This magnetic field (B) 215 can produce a force component (F) 230 (i.e., force) on a magnetic element 220 affixed to a surface (e.g., back surface 235) of the flexible display 130 that is in a direction (e.g., towards the surface 195) to reduce (e.g., remove) the deformation.

The magnetic element can be any material that is attracted to electromagnetic when the electromagnet is activated (i.e., energized). In other words, the magnetic element 220 can be any material that is magnetized or capable of being magnetized, including (but not limited to) ferromagnetic materials (e.g., iron, nickel, cobalt, neodymium, etc.) and magnetized materials (e.g., a permanent magnet). Additionally, the magnetic element 220 may be a combination of materials. For example, the magnetic element 220 may include a suspension of magnetic particles in a semi-liquid substance that can be hardened, such as a magnetic (e.g., ferromagnetic) adhesive.

The magnetic element 220 may have a size, shape and orientation for interaction with the generated magnetic field so that the force (F) 230 induced on the magnetic element 220 counteracts the force or forces (e.g., within layers of the flexible display 130) that cause the deformation 201. For example, the magnetic element may be a rod (e.g., circular, rectangular, etc.) that is affixed to a back surface 235 (i.e., surface facing the first portion 110 and second portion 120) of the flexible display 130, so that (as shown in FIG. 2) the rod extends along the length of a ridge deformation at its peak. In another example, the magnetic element 220 may be formed as a pattern (e.g., line) of magnetic adhesive applied to the back surface 235 of the flexible display 130 that extends along the length of the ridge at its peak. In another embodiment, the magnetic element 220 is integrated within the layers of the flexible display 130. In general, the magnetic element is not limited to any particular number, arrangement, pattern, size, shape, orientation and/or position as long at the deformation 201 can be reduced or eliminated upon activation of the electromagnet.

The force 230 generated to remove a deformation 201 may be required only when the body is in an unfolded configuration (see FIG. 1B). For these embodiments, the electromagnetic mechanism may activate and deactivate the electromagnet based on the configuration of the body. For example, when the body is unfolded, the electromagnet may be activated, and when folded the electromagnet may be deactivated (e.g., to save energy). Thus, the electromagnetic mechanism may include one or more sensors to determine the configuration of the body and one or more switching devices to activate and deactivate the electromagnet.

Figure 3:
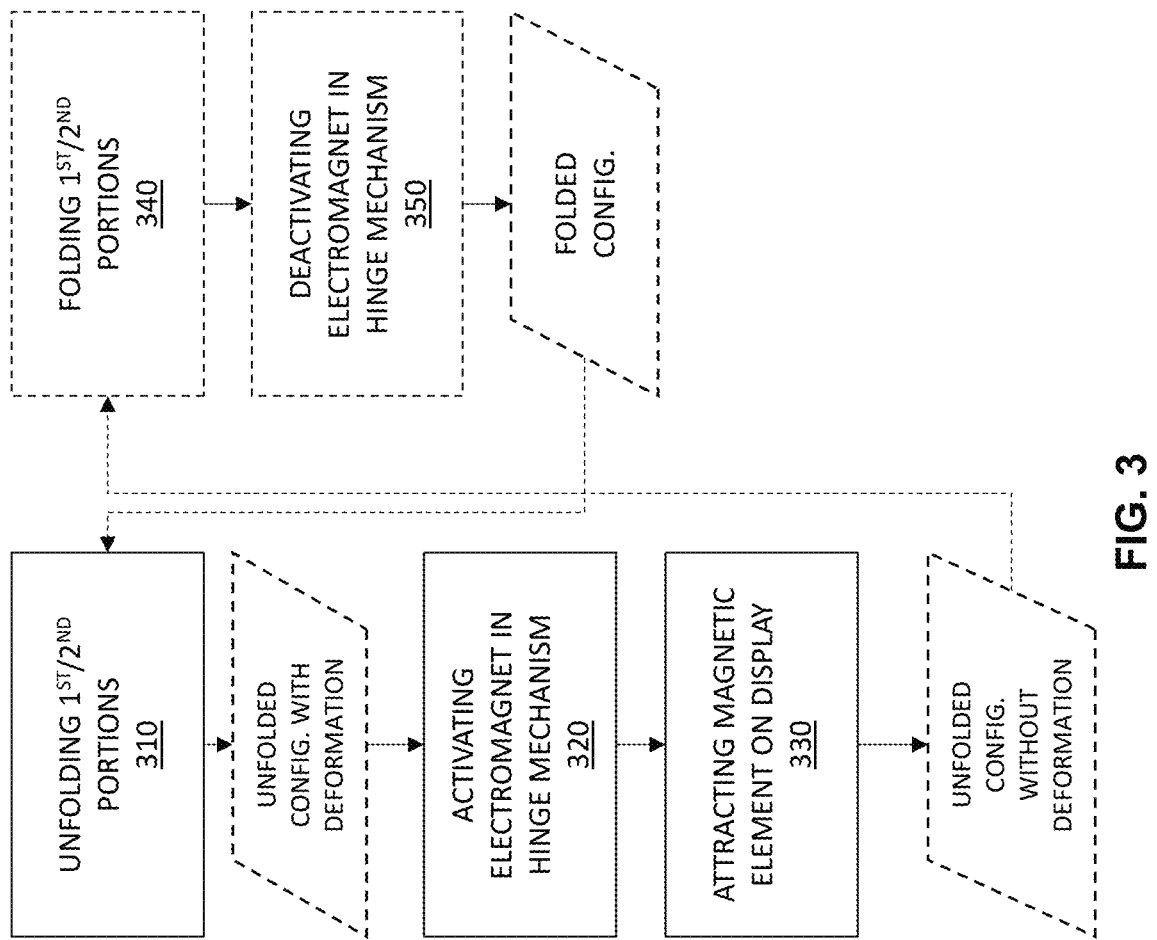
FIG. 3 is a flowchart of a method for configuring a mobile computing device according to a possible embodiment of the present disclosure.

A flowchart of a method for configuring the mobile computing device 100 is shown in FIG. 3. The method includes unfolding 310 a first portion and a second portion of a mobile computing device using a hinge mechanism. When unfolded a flexible display covers the first and second portions but has a deformation resulting from the unfolding. Accordingly, an electromagnet in the hinge mechanism is activated 320 to produce a magnetic field, and a magnetic element disposed on a surface of the flexible display is attracted 330 by the magnetic field to remove the deformation. The method can further include returning the mobile computing device to a folded configuration by folding 340 the first and second portions using the hinge mechanism and deactivating 350 the electromagnet.

In a possible embodiment, the magnetic field produced by the electromagnetic may require adjustment to accommodate changes in the system. For example, the flexibility of the flexible display may change over time or over temperature, and this change may change the required force to reduce or remove the deformation. Thus, in an embodiment of the method, activating 320 the electromagnet may include adjusting the current of the electromagnet (i.e., until the deformation is removed).

While the flexible (e.g., OLED) display has be described for a mobile computing device embodiment, the principles and technology disclosed may be applied more generally. For example, alternative flexible displays (e.g., televisions, avionics display, automotive display, etc.) may include a body (e.g., frame) that can be configured (e.g., using a hinge mechanism) in a folded configuration or an unfolded configuration. These displays may have a deformation resulting from the folding/unfolding. Accordingly, the electromagnetic deformation removal methods and technology described herein may be applied to reduce or remove the deformation of these displays as well.

Figure 4:
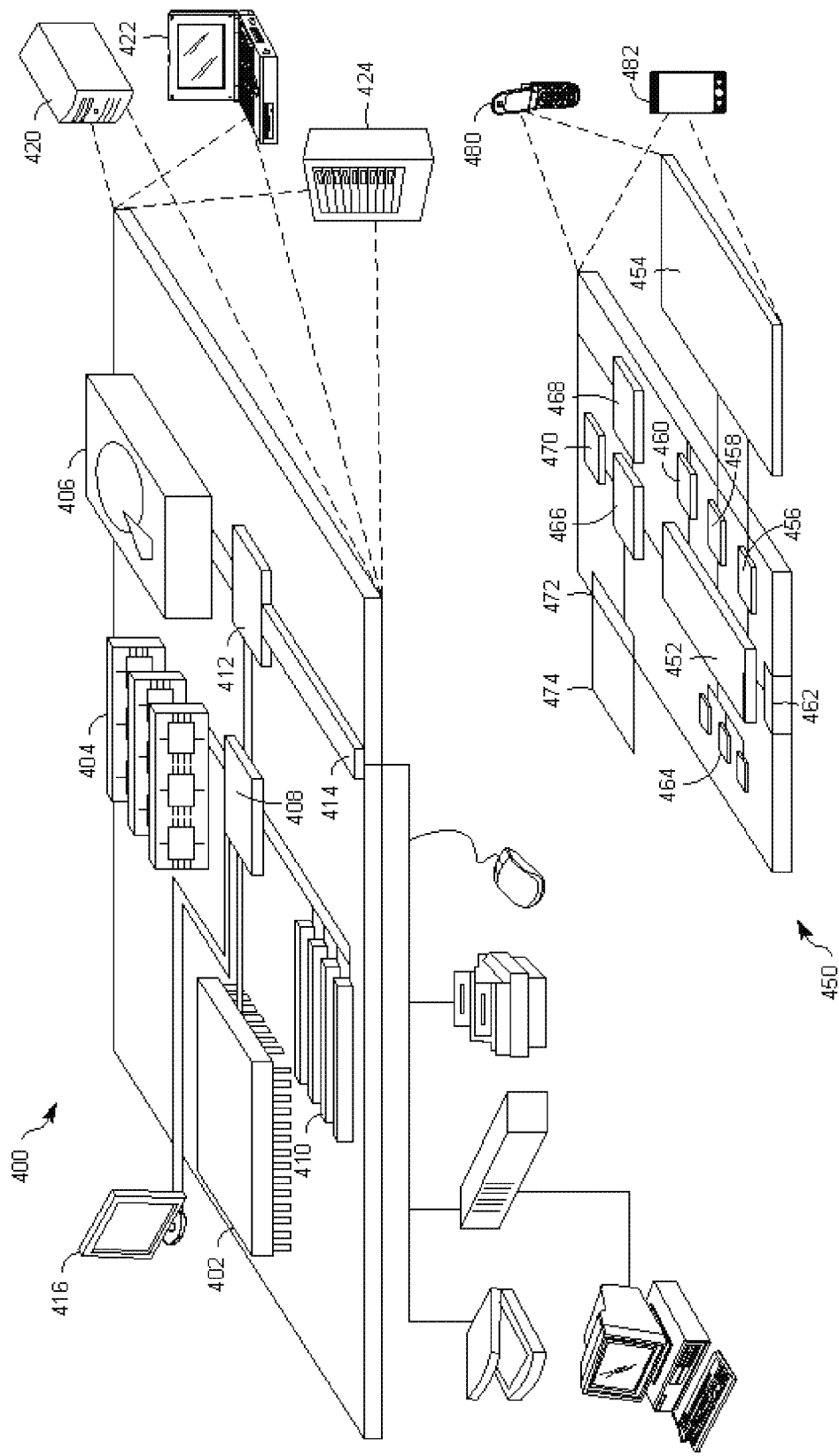
FIG. 4 shows an example of a computer device and a mobile computer device that can be used to implement the techniques described here.

FIG. 4 shows an example of a generic computer device 400 and a generic mobile computer device 450, which may be used with the techniques described here. Computing device 400 is intended to represent various forms of digital computers, such as laptops, desktops, tablets, workstations, personal digital assistants, televisions, servers, blade servers, mainframes, and other appropriate computing devices. Computing device 450 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 400 includes a processor 402, memory 404, a storage device 406, a high-speed interface 408 connecting to memory 404 and high-speed expansion ports 410, and a low speed interface 412 connecting to low speed bus 414 and storage device 406. The processor 402 can be a semiconductor-based processor. The memory 404 can be a semiconductor-based memory. Each of the components 402, 404, 406, 408, 410, and 412, are interconnected using various buses, and may be mounted on a common motherboard or in other manners as appropriate. The processor 402 can process instructions for execution within the computing device 400, including instructions stored in the memory 404 or on the storage device 406 to display graphical information for a GUI on an external input/output device, such as display 416 coupled to high speed interface 408. In other implementations, multiple processors and/or multiple buses may be used, as appropriate, along with multiple memories and types of memory. Also, multiple computing devices 400 may be connected, with each device providing portions of the necessary operations (e.g., as a server bank, a group of blade servers, or a multi-processor system).

The memory 404 stores information within the computing device 400. In one implementation, the memory 404 is a volatile memory unit or units. In another implementation, the memory 404 is a non-volatile memory unit or units. The memory 404 may also be another form of computer-readable medium, such as a magnetic or optical disk.

The storage device 406 is capable of providing mass storage for the computing device 400. In one implementation, the storage device 406 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 404, the storage device 406, or memory on processor 402.

The high speed controller 408 manages bandwidth-intensive operations for the computing device 400, while the low speed controller 412 manages lower bandwidth-intensive operations. Such allocation of functions is exemplary only. In one implementation, the high-speed controller 408 is coupled to memory 404, display 416 (e.g., through a graphics processor or accelerator), and to high-speed expansion ports 410, which may accept various expansion cards (not shown). In the implementation, low-speed controller 412 is coupled to storage device 406 and low-speed expansion port 414. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 400 may be implemented in a number of different forms, as shown in the figure. For example, it may be implemented as a standard server 420, or multiple times in a group of such servers. It may also be implemented as part of a rack server system 424. In addition, it may be implemented in a personal computer such as a laptop computer 422. Alternatively, components from computing device 400 may be combined with other components in a mobile device (not shown), such as device 450. Each of such devices may contain one or more of computing device 400, 450, and an entire system may be made up of multiple computing devices 400, 450 communicating with each other.

Computing device 450 includes a processor 452, memory 464, an input/output device such as a display 454, a communication interface 466, and a transceiver 468, among other components. The device 450 may also be provided with a storage device, such as a microdrive or other device, to provide additional storage. Each of the components 450, 452, 464, 454, 466, and 468, are interconnected using various buses, and several of the components may be mounted on a common motherboard or in other manners as appropriate.

The processor 452 can execute instructions within the computing device 450, including instructions stored in the memory 464. The processor may be implemented as a chipset of chips that include separate and multiple analog and digital processors. The processor may provide, for example, for coordination of the other components of the device 450, such as control of user interfaces, applications run by device 450, and wireless communication by device 450.

Processor 452 may communicate with a user through control interface 458 and display interface 456 coupled to a display 454. The display 454 may be, for example, a TFT LCD (Thin-Film-Transistor Liquid Crystal Display) or an OLED (Organic Light Emitting Diode) display, or other appropriate display technology. The display interface 456 may comprise appropriate circuitry for driving the display 454 to present graphical and other information to a user. The control interface 458 may receive commands from a user and convert them for submission to the processor 452. In addition, an external interface 462 may be provided in communication with processor 452, so as to enable near area communication of device 450 with other devices. External interface 462 may provide, for example, for wired communication in some implementations, or for wireless communication in other implementations, and multiple interfaces may also be used.

The memory 464 stores information within the computing device 450. The memory 464 can be implemented as one or more of a computer-readable medium or media, a volatile memory unit or units, or a non-volatile memory unit or units. Expansion memory 474 may also be provided and connected to device 450 through expansion interface 472, which may include, for example, a SIMM (Single In Line Memory Module) card interface. Such expansion memory 474 may provide extra storage space for device 450, or may also store applications or other information for device 450. Specifically, expansion memory 474 may include instructions to carry out or supplement the processes described above, and may include secure information also. Thus, for example, expansion memory 474 may be provided as a security module for device 450, and may be programmed with instructions that permit secure use of device 450. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 464, expansion memory 474, or memory on processor 452, that may be received, for example, over transceiver 468 or external interface 462.

Device 450 may communicate wirelessly through communication interface 466, which may include digital signal processing circuitry where necessary. Communication interface 466 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 468. In addition, short-range communication may occur, such as using a Bluetooth, WiFi, or other such transceiver (not shown). In addition, GPS (Global Positioning System) receiver module 470 may provide additional navigation- and location-related wireless data to device 450, which may be used as appropriate by applications running on device 450.

Device 450 may also communicate audibly using audio codec 460, which may receive spoken information from a user and convert it to usable digital information. Audio codec 460 may likewise generate audible sound for a user, such as through a speaker, e.g., in a handset of device 450. Such sound may include sound from voice telephone calls, may include recorded sound (e.g., voice messages, music files, etc.) and may also include sound generated by applications operating on device 450.

The computing device 450 may be implemented in a number of different forms, as shown in the figure. For example, it may be implemented as a cellular telephone 480. It may also be implemented as part of a smart phone 482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation. Unless defined otherwise, all technical and scientific terms used herein have the same meaning as commonly understood by one of ordinary skill in the art.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A mobile computing device comprising:
   a body that includes first and second portions connected by a hinge mechanism, the body being configurable into a folded configuration or an unfolded configuration by operation of the hinge mechanism;
   a flexible display that is connected to and supported by the first and second portions of the body in the folded configuration and in the unfolded configuration;
   a magnetic element disposed on a back surface of the flexible display; and
   an electromagnet in the hinge mechanism of the body configured to attract the magnetic element toward the hinge mechanism to maintain the flexible display in a flat configuration when the body is in the unfolded configuration, wherein the electromagnet includes a conductor configured to carry a current in a direction aligned with an axis of rotation of the hinge mechanism.

2. The mobile computing device according to claim 1, wherein in the folded configuration, the first and second portions are folded together at the hinge mechanism and the flexible display is wrapped around the first and second portions, and wherein in the unfolded configuration, the first and second portions are unfolded flat at the hinge mechanism, and the flexible display covers the first and second portions.

3. The mobile computing device according to claim 1, wherein the electromagnet is configured to, through attraction of the magnetic element toward the hinge mechanism, remove a deformation in the flexible display, wherein the deformation includes a ridge that rises above the first and second portions in the unfolded configuration, the ridge being aligned with the hinge mechanism.

4. The mobile computing device according to claim 3, wherein the ridge rises above the first and second portions in the unfolded configuration by less than five millimeters.

5. The mobile computing device according to claim 1, wherein operation of the hinge mechanism produces a rotational motion and a lateral motion between the first and second portions.

6. The mobile computing device according to claim 1, wherein the conductor is configured as a coil.

7. The mobile computing device according to claim 3, wherein the magnetic element is disposed on the back surface of the flexible display at a location corresponding to the deformation.

8. The mobile computing device according to claim 7, wherein the magnetic element includes a ferromagnetic rod.

9. The mobile computing device according to claim 7, wherein the magnetic element includes a ferromagnetic adhesive.

10. The mobile computing device according to claim 1, wherein the flexible display includes a flexible organic light emitting diode (OLED) display.

11. The mobile computing device according to claim 1, wherein the electromagnet is activated when the body is configured in the unfolded configuration and is deactivated when the body is configured in the folded configuration.

12. A method for configuring a mobile computing device, the method comprising:

unfolding, using a hinge mechanism, first and second portions of a body of the mobile computing device so that a flexible display of the mobile computing device covers the first and second portions, the flexible display having a deformation resulting from the unfolding;

activating an electromagnet in the hinge mechanism to produce a magnetic field, wherein the activating includes producing a current in a conductor of the electromagent, the current being in a direction aligned with an axis of rotation of the hinge mechanism; and attracting, using the magnetic field, a magnetic element disposed on a back surface of the flexible display toward the hinge mechanism to remove the deformation.

13. The method for configuring a mobile computing device according to claim 12, wherein activating the electromagnet includes:

generating a current in a conductor in the hinge mechanism.

14. The method for configuring a mobile computing device according to claim 12, wherein the flexible display includes a foldable OLED.

15. The method for configuring a mobile computing device according to claim 12, wherein the magnetic element includes a ferromagnetic adhesive.

16. The method for configuring a mobile computing device according to claim 12, further comprising:

folding, using the hinge mechanism, the first and second portions of the body of the mobile computing device so that the flexible display of the mobile computing device wraps around the first and second portions; and deactivating the electromagnet at the hinge mechanism.

17. A display comprising:

a body configurable by a hinge mechanism into a folded configuration or into an unfolded, flat configuration;

a flexible display attached to the body that is folded or unfolded according to the configuration of the body;

a magnetic element disposed on a back surface of the flexible display; and an electromagnet in the hinge mechanism of the body that attracts is configured to attract the magnetic element towards the hinge mechanism to maintain the flexible display in a flat configuration when it is unfolded, wherein the electromagnet includes a conductor configured to carry a current in a direction aligned with an axis of rotation of the hinge mechanism.

18. The display according to claim 17, wherein the flexible display includes an organic light emitting diode (OLED) display.

* * * * *